United States Patent [19]

Grossa

[11] Patent Number: 4,716,095

[45] Date of Patent: Dec. 29, 1987

[54] METHOD FOR REDUCING COLOR CROSS-CONTAMINATION DURING RE-IMAGING OF PHOTOTACKIFIABLE MATERIALS

[75] Inventor: Mario Grossa, Dreieich, Fed. Rep. of Germany

[73] Assignee: E. I. Du Pont de Nemours and Company, Wilmington, Del.

[21] Appl. No.: 930,102

[22] Filed: Nov. 12, 1986

[30] Foreign Application Priority Data

Nov. 16, 1985 [DE] Fed. Rep. of Germany ....... 3540804

[51] Int. Cl.$^4$ ............................................... G03C 5/00
[52] U.S. Cl. ...................................... 430/291; 430/28; 430/327; 430/952
[58] Field of Search ................. 430/291, 28, 327, 952, 430/270

[56] References Cited

U.S. PATENT DOCUMENTS

| | | | |
|---|---|---|---|
| 4,243,741 | 1/1981 | Abele et al. | 430/270 |
| 4,269,918 | 5/1981 | Nonogaki et al. | 430/28 |
| 4,273,842 | 6/1981 | Nonogaki et al. | 430/25 |
| 4,292,394 | 9/1981 | Chu et al. | 430/291 |
| 4,407,916 | 10/1983 | Akagi et al. | 430/23 |
| 4,604,340 | 8/1986 | Grossa | 430/270 |

Primary Examiner—John E. Kittle
Assistant Examiner—Cynthia Hamilton

[57] ABSTRACT

A process is described to improve the reproduction quality of multiply exposable negatively tonable light-sensitive reproduction materials containing at least one 1,4-dihydropyridine compound, wherein the light-sensitive layer is treated with a strong acid before the imagewise exposure.

10 Claims, No Drawings

METHOD FOR REDUCING COLOR CROSS-CONTAMINATION DURING RE-IMAGING OF PHOTOTACKIFIABLE MATERIALS

BACKGROUND OF THE INVENTION

The invention relates to a process to improve the reproduction quality of reproductions produced using multiple exposure, negatively tonable light-sensitive reproduction materials.

Reproduction processes are known in which differences in the tackiness of the exposed and unexposed areas of the light-sensitive layer are used to produce the image. The images are made visible by dusting on suitable toners, which adhere only to the tacky areas and can be removed from the non-tacky areas. Of particular importance are reproduction materials with which several successive exposure- and toning steps using different toners can be undertaken on the same light-sensitive layer.

Such materials are known and are preferred in practical use for the production of multicolor images, for carrying out color proofing processes, e.g., for the production of maps, electronic circuits, and for the production of fluorescent screens for cathode ray tubes.

Reproduction materials that contain either a light-sensitive dihydropyridine compound or a light-sensitive system consisting of a dihydropyridine compound and a hexarylbisimidazole compound have proven to be particularly useful for the said purposes. Such materials are described in U.S. Pat. No. 4,243,741 as well as U.S. Pat. No. 4,604,340, the teaching of which is hereby incorporated by reference.

A general problem with multiple exposure and tonable materials is in carrying out the successive exposure- and toning steps so that they are not detrimental to one another. There is, in fact, a danger that a previously toned area, if it is not sufficiently saturated with toner, still has a residual tackiness so that it becomes contaminated by a different type of toner to be applied in a subsequent toning step.

Contamination can also be caused by a small amount of the photochemically formed, tackiness-producing light conversion product being formed during the imagewise exposure in edge areas outside the imagewise exposed tonable area in a concentration that lies below the tackiness threshold. If this area is also in the edge area of a subsequent exposure, its concentration can increase additively, however, so that the tackiness threshold is crossed and these areas then become contaminated due to uptake of toner. This effect can also occur in already toned areas. This tackiness produced additively by repeated exposures is also called "induced tackiness" below. These types of contamination impair the reproduction quality, especially color reproduction, brightness, and contrast, and in certain cases lead to dot- and line spreading.

The reproduction quality can also be impaired by a diffuse initial tackiness that can be caused by a slight preexposure and/or storage of the starting material under unfavorable conditions, and that likewise leads to contamination.

Some processes to prevent undesired contamination have become known from the literature. For example, it is known from U.S. Pat. No. 4,292,394 to polish the toned areas by wiping or rubbing after each exposure- and toning stage and thus to reduce the tackiness of these areas to such an extent that they cannot accept any further toner. Apart from the fact that such wiping or rubbing is not feasible for all applications, such as, e.g., in the reproduction of fine image elements with line widths $\leq 50$ μm, an induced tackiness caused by subsequent exposures cannot be prevented in this manner.

A multiply tonable reproduction material is known from U.S. Pat. No. 4,273,842, Nonogaki et al., that contains a diazonium salt as the light-sensitive substance. When this is exposed, a hygroscopic decomposition product is formed that becomes tacky by absorption of water. In this patent it is mentioned that the applied toner can be fixed by treatment in an ammonia atmosphere, but with the disadvantage that the unexposed areas are also affected and then are tonable in a subsequent toning stage only inadequately or not at all.

From German Preliminary Published Application No. 2 934 929 it is known to fix the toner using a powdery material that reacts with the photolytic reaction product of the aromatic diazonium salt, e.g., zinc chloride, and forms a solid material insoluble in water. Suitable powdery materials are e.g., alkali- and alkaline earth metal hydroxides, -carbonates, -phosphates, etc.

European Pat. No. 061 310 describes a process according to which an inert filler whose particle size is smaller than that of the toner particle is applied to the toned areas. This method and likewise the process of German Preliminary Published Application No. 2 934 929 are indeed suitable to eliminate an already existing residual tackiness, but they are not suitable to prevent tackiness induced by subsequent exposures. To do this it is necessary that the light reaction products whose concentration lies below the tackiness threshold also be converted during the posttreatment into non tacky products, since only thus can the addition effect be prevented. Since these areas are not tacky, however, there is inadequate contact between the finely-divided powders suggested in German Preliminary Application No. 2 934 929 and European Pat. No. 061 301 and the light conversion product lying below the toning threshold, for such a conversion to take place, so that these means are unsuitable for the prevention of an induced tackiness.

It was therefore the object of the present invention to give a process to improve the reproduction quality of multiply exposable negatively tonable light-sensitive reproduction materials that contain at least one 1,4-dihydropyridine compound, in which both the present residual tackiness of the toned areas and also the "induced tackiness" produced by subsequent exposures is eliminated without impairing the respective unexposed areas.

This object was achieved by a process according to which a negative working tonable light sensitive layer containing at least one 4-(2'-nitrophenyl)-1,4-dihydropyridine compound and/or at least one 1,4-dihydropyrine compound and at least one hexarylbisimidazole compound is applied onto at least one side of a substrate, is exposed imagewise, whereby the exposed areas become tacky, the tacky areas are toned by applying a finely-divided powder, whereby the exposure and toning steps can be carried out repeatedly in different areas with different toners and whereby the process is characterized in that the light-sensitive layer is treated before the first imagewise exposure and/or between each toning stage and the subsequent exposure with a strong inorganic or organic acid having a pKa value $\leq 2.0$.

Suitable strong acids to carry out the process are, e.g.: HCl, HBr, HNO$_3$, H$_2$SO$_4$, p-toluenesulfonic acid and amidosulfonic acid, whereby the volatile acids have proven particularly good.

The acid treatment can be carried out in various ways.

According to a preferred form of embodiment, the light sensitive material is exposed to the vapor of the acid before the first exposure and/or between each toning step and the subsequent exposure.

In practice, for example, a layer of light-sensitive material on a substrate that has already been exposed and toned once, is inserted before the second exposure into a chamber charged with anhydrous or hydrous acid vapor or an air mixture containing acid vapor.

According to a particularly preferred method, the atmosphere of the chamber is saturated at 25° C. with the vapor of a 25 wt.-% hydrochloric acid solution. The length of the acid treatment is governed by the thickness of the light-sensitive layer and is, e.g., about 30-60 seconds for a 1 μm thick layer. After the acid treatment, any excess can be removed by blowing it off in an air current at 18°-40° C.

The treatment can also be carried out with the aqueous solutions of the acids, whose concentration is preferably between 0.5 and 5 wt.-%. In this case, the treatment can be carried out simply by immersion in the aqueous solution and subsequent rinsing with water.

According to another form of embodiment, the treatment can also be carried out by applying finely-divided powders that serve as carrier material and are changed with a strong acid. Suitable powders for the carrier material are natural or synthetic polymers, e.g., polyamides, polyalkylene oxides, polyvinyl alcohol, polyvinylpyrrolidone, polyacrylates such as, e.g., polyacrylmethacrylate, and copolymers of acrylic acid and maleic acid anhydride. Kaolin, SiO$_2$, CaSO$_4$, Al$_2$O$_3$, and the like are also suitable. It is preferable to charge the carrier material with acid by mixing the carrier material with the aqueous acid, with the mixture ratios being selected such that the powder remains flowable.

According to the described process, multiple negative patterns of various powdery materials are obtained that are distinguished above all by improved color reproduction, increased contrast, and sharp-edged reproduction of dots and lines.

The process is therefore particularly suitable for the production of fluorescent screens for color picture tubes or of proofing prints in which a perfect line reproduction is required, such as, e.g., in the production of maps.

It is assumed that the superior effect of the strong acid compared with the state of the art is based on the fact that it diffuses into the photosensitive layer and as a result can also form non-tacky salts with the basic tacky light reaction products present at a concentration below the tackiness threshold. Moreover, tackiness caused by subsequent exposures in already toned areas is prevented by the diffusion of the acid into the layer.

The fact that color contamination caused by a residual tackiness and/or an induced tackiness can be prevented by an acid treatment was surprising. Those skilled in the art would in fact have expected that the tack effect between the toner and the light-sensitive layer would be removed by the acid treatment in the already toned areas and that the toner would fall off in these areas.

It was also surprising that the sensitivity of the unexposed areas is not impaired or only impaired slightly by acid diffused into the layer.

The process of the invention is suitable for negative working tonable light-sensitive layers that contain either a light-sensitive 1,4-dihydropyrine compound or a light-sensitive system consisting of a 1,4-dihydropyridine compound and a hexaarylbisimidazole compound.

Particularly suitable compounds are 1,4-dihydropyridine compounds substituted in the 4-position by a 2'-nitrophenyl ring, that correspond to the following general formula:

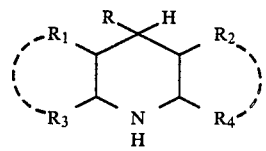

in which:
R denotes 2'-nitrophenyl, whereby the phenyl radical can be substituted by C$_1$ to C$_4$ alkyl- or oxalkyl-, OH—, halogen-, NH$_2$-groups.

R$_1$ and/or R$_2$ denote CN, COOR' or COR', whereby R' represents an alkyl group having 1-11 carbon atoms, which can also be substituted with —OCH$_3$ or —OC$_2$H$_5$ and whereby R$_1$ and R$_2$ can be the same or different.

R$_3$ and R$_4$ denote C$_1$ to C$_4$ alkyl, whereby R$_3$ and R$_4$ can be the same or different.

R$_1$ and R$_3$ and/or R$_2$ and R$_4$ denote the atoms required to complete a 5- or 6-membered carbocyclic or heterocyclic ring containing a carbonyl group.

Further suitable compounds can be taken from applicant's U.S. Pat. No. 4,604,340, issued Aug. 5, 1986, the teaching of which is incorporated herein by reference.

Among these are the following compounds:
2,4,6-trimethyl-3,5-bis(carbethoxy)-1,4-dihydropyridine; 2,6-dimethyl-4-ethyl-3,5-bis(carbethoxy)-1,4-dihydropyridine; 2,6-dimethyl-4-n-propyl-3,5-bis(carbethoxy)-1,4-dihydropyridine; and 2,6-dimethyl-4-benzyl-3,5-bis(carbethoxy)-1,4-dihydropyridine. Suitable hexaarylbisimidazole compounds, the second component of the light-sensitive system, can be taken from Table 2 of the said patent.

Especially preferred are: 2,2',4,4',5,5'-hexaphenyl biimidazole: 2,2'-bis(2-chlorophenyl)-4,4',5,5'-tetrakis(3-methoxyphenyl)biimidazole; and 2,2'-bis(2-methoxyphenyl)-4,4',5,5'-tetraphenyl biimidazole.

The light-sensitive compounds can be applied by known methods, alone or mixed together or jointly with a binder. Suitable binders are: polyacrylic acid esters or polymethacrylic acid esters and their copolymers with acrylic or methacrylic acid or other acryl- or vinyl monomers, respectively; copolymers of maleic acid anhydride, of maleic acid or their di- or semiesters with styrene. or other vinyl monomers; chlorine-containing vinyl polymers or copolymers such as, e.g., polyvinyl chloride and its polychlorination products, polyvinylidene chloride, chlorinated polyethylene, etc.; polystyrene and polystyrene copolymers: ethylene and ethylene copolymers, e.g., with maleic acid, etc., synthetic rubber types based on butadiene, chloroprene, etc.; and their copolymers, e.g. with styrene and acrylonitrile. etc.; polyethers such as, e.g., high-molecular-weight polyethylene oxides or polyepichlorohydrin, etc.

The layers can optionally contain further additives such as, e.g., sensitizers, stabilizers, optical brighteners, matting agents, coating agents, or others. Benzophenone and 2-ethyl anthraquinone, among others, have proven to be particularly usable as sensitizers. A large number of transparent or opaque materials are suitable as supports for the light-sensitive layer. The following are examples: papers, optionally baryta-coated; cardboard; metal films, e.g., of aluminum, copper, steel, etc.; wood; glass; porcelain; ceramics; films, or non-wovens of natural or synthetic polymers.

If required, other layers can also be present on the layer support, e.g., substrata.

A special protective film over the light-sensitive layer, which would have to be peeled off before the toning process, is not necessary in principle. If desired, however, it can be applied to avoid damage to the light-sensitive layer.

The layer is exposed with ultraviolet light. A wavelength range of 300–400 nm is preferred. Suitable light sources are, e.g., xenon lamps, mercury vapor lamps, and fluorescent lamps.

After the imagewise exposure, the tacky exposed image areas are toned with a suitable toner, in order to reproduce the desired color.

The toner can be applied on the exposed layer either manually, e.g., using a cotton pad, or using special applicators. Suitable methods are known to those skilled in the art.

For the toning, toners consisting of finely-divided powders of very varied composition can be used. For example, inorganic or organic pigments, phosphors, metal powders, or else soluble organic dyes in pure form or on a powdery organic or inorganic carrier, are suitable.

The carrying out of the described process is described below using the production of a fluorescent screen for a color picture tube as an example.

A thin light-sensitive layer is applied on the inside of a television screen by rotation coating and then dried. This layer is then exposed through a shadow- or perforated mask and the exposed tacky strip- or circular image elements are toned with a phosphor powder of one of the colors blue, green or red. The screen is then exposed to a hydrochloric acid atmosphere. After a subsequent second displaced exposure, other areas of the light-sensitive layer in the form of strip- or circular image elements are likewise toned with a second color, the toned areas are likewise exposed to a hydrochloric acid atmosphere under the same conditions. Subsequently through a third displaced exposure other areas of the light-sensitive layer likewise in the form of strip- or circular image elements are made tacky and are toned with the phosphor of the third color. The light-sensitive layer is subsequently removed by heating at temperatures >450° C.

The following examples are intended to illustrate the invention. All percentages refer to percentages by weight.

EXAMPLE 1

A solution of 5 g of dimethyl ester of 2,6-dimethyl-4-(2'-nitrophenyl)-1,4-dihydropyridine-3,5-dicarboxylic acid, and 5 g of diethyl ester of 2,6-dimethyl-4-(2'-nitrophenyl)-1,4-dihydropyridine-3,5-dicarboxylic acid in 100 mL of methyl ethyl ketone is applied on 2 glass plates A and B. After drying, the layer thickness is 1.6 $\mu$m. Both plates are exposed for 60 seconds through a $3\sqrt{2}$ step wedge with a light source equipped with UV-emitting Sylvania Black Lite tubes and having an irradiation intensity of 3 mW/cm$^2$, and are subsequently toned by dusting them with a black toner (average particle diameter 3.5 $\mu$m).

Glass plate A is then exposed for 30 seconds to the vapor of a 20% aqueous hydrochloric acid and air blown over it.

Both plates are subsequently reexposed as given above, with the step wedge being positioned so that the two images lie parallel and partially overlap.

They are subsequently toned with a blue-emitting ZnS-phosphor powder (average particle diameter 6 $\mu$m) and the non-adhering excess is blown off with an air current.

The results are summarized in Table 1:

TABLE 1

| | Plate A | Plate B |
| --- | --- | --- |
| 1. Black image Number of blackened steps | 5 | 5 |
| 2. Phosphor image Number of blue steps | 5 | 5 |
| 3. Overlapping area Number of blue steps | 0 | 3 |

It can be seen from the table that the effect of below-threshold reexposure is cancelled by the acid treatment, without impairing the sensitivity of the unexposed layer.

EXAMPLE 2

Two plates A and B are produced according to the data of Example 1 and are exposed for 30 seconds through a line original with the light source described in Example 1 and are toned with blue-emitting phosphor powder.

Plate A is then shaken in a powder produced by mixing 30 parts by weight of 17% hydrochloric acid and 70 parts of precipitated siilcic acid, and the excess is blown off. Both plates are then exposed as given above, with parts of the two images overlapping. Finally, they are toned with red-emitting phosphor powder (average particle diameter 5.5 $\mu$m). Pattern A treated with acid shows no comtamination of the blue areas by red phosphor, whereas comparative pattern B is contaminated considerably.

EXAMPLE 3

A solution of 7.5 g of dimethyl ester of 2,6-dimethyl-4-(2'-nitrophenyl)-1,4-dihydropyridine-3,5-dicarboxylic acid, and 7.5 g of diethyl ester of 2,6-dimethyl-4-(2'-nitrophenyl)-1,4-dihydropyridine-3,5-dicarboxylic acid in 200 mL of methyl ethyl ketone is applied onto 2 glass plates A and B so that the layer thickness after drying is 0.9 $\mu$m. Then the plates are exposed without an original for 50 seconds with parallel mercury fluorescent tubes (irradiation intensity 3 mW/cm$^2$) and are toned with a blue-emitting phosphor powder.

Plate A is then treated with a powder (average particle diameter 4.5 $\mu$m) consisting of a spherical polymer material produced by suspension polymerization of trimethylol propane triacrylate.

Plate B is treated with the same powder, but charged with hydrochloric acid. The powder was charged by mixing 4 g of polytrimethylol propane triacrylate with 1 mL of 25% hydrochloric acid. The already toned areas are reexposed without an original and are toned with a red phosphor powder.

Whereas plate A is severely contaminated by the red phosphor powder, plate B has a high degree of color purity.

EXAMPLE 4

A glass plate is coated with a solution of 10 g of diethyl ester of 2,6-dimethyl-4-(2'-nitrophenyl)-1,4-dihydropyridine-3,5-dicarboxylic acid in 100 mL of methyl ethyl ketone so that the layer thickness after drying is 1.0 μm. It is then exposed through a line original for 30 seconds at a distance of 40 cm with a mercury vapor lamp (1000 W) and is toned with a blue zinc sulfide phosphor powder. The plate is then immersed, first in a 1% aqueous hydrochloric acid for 15 seconds at 20° C. and subsequently in water, and is then dried in an air current.

A still unexposed part of the plate is exposed under the same conditions as above and is toned with a red phosphor powder.

Two images are formed of high color purity.

EXAMPLE 5

A solution of
5 g of di-(β-methoxyethyl)-ester of 2,6-dimethyl-4-(2'-nitro-, 4',5',-dimethoxyphenyl)-1,4-hydropyridine-3,5-dicarboxylic acid in 100 mL of methyl ethyl ketone is applied onto the inside of the screen of 2 color picture tubes A and B by centrifugation so that the thickness of the dried layer is 1.2 μm.

Both screens are then exposed one after the other on a conventional television exposure table, using a 1000 W mercury vapor lamp through a slitted shadow mask with an energy of 180 mJ/cm$^2$ in the "green" position, and a green strip pattern is produced by toning with a green phosphor powder.

Color picture tube A is then exposed for 60 seconds at 22° C. to the vapor of a 20% hydrochloric acid, which is then blown away with an air current.

Color picture tube B remains untreated. Then color picture tubes A and B are exposed in the "red" position as given above, and are toned with a red phosphor.

Color picture tube A exhibits a pattern of 2 color-pure lines, whereas on color picture tube B, the green line is contaminated on one side by a red seam.

EXAMPLE 6

A solution of
10 g of diethyl ester of 2,6-dimethyl-4-(2'-nitrophenyl)-1,4-dihydropyridine-3,5-dicarboxylic acid in 100 mL of methyl ethyl ketone is applied by centrifugation onto the inside of the screen of a color picture tube A. The thickness of the dried layer is 1.5 μm. It is then exposed in the "green" position on a television exposure table, as given in Example 4.

After the mask has been removed, toning is carried out with a green phosphor powder, forming a green negative strip pattern. After the excess phosphor has been blown off, a powdery mixture of 3 parts by weight of amorphous precipitated silicic acid charged with 1 part of 20% aqueous hydrochloric acid is applied, and is distributed on the toned surface by shaking for 30 seconds. The powder charged with hydrochloric acid is then removed by blowing with air, the mask is again put into place, and the second blue and third red phosphor layers are applied similarly, with the treatment with the hydrochloric acid-charged powder being carried out before the third exposure.

A second color picture tube B is produced by the same method, the only difference being that the intermediate treatment is carried out with a powdery mixture comprising 20 g of precipitated silicic acid charged with 8 mL of 20% hydrobromic acid.

Finally, a third color picture tube C is produced by the same method, the only difference being that the intermediate treatment is carried out with powdery precipitated silicic acid not charged with a strong acid.

The results obtained are shown in Table 2:

TABLE 2

| | Color picture tube | | |
|---|---|---|---|
| | A | B | C |
| Line sharpness | very good | very good | good |
| Color purity | good | good | inadequate |

It can be seen from this example that contamination caused by induced tackiness can not be prevented by simply covering with a finely-divided powder.

EXAMPLE 7

A solution of 10 g of diethyl ester of 2,6-dimethyl-4-(2'-nitrophenyl)-1,4-dihydropyridine-3,5-dicarboxylic acid in 100 mL of methyl ethyl ketone is applied onto 2 ceramic plates A and B by rotation coating. The layer thickness is 1.5 μm. Plates A and B are exposed through an original that corresponds to 2 parallel strip conductors (5 mm long/0.05 mm wide) for 90 seconds with a 1000 W mercury vapor lamp at a distance of 40 cm, and are subsequently toned with gold powder of an average particle size of 2 μm.

Plate A is then treated with a powder charged with hydrochloric acid according to the data of Example 2. Plate B remains untreated.

Then plates A and B are exposed through an original that consists of an 8 mm wide and 5 mm long strip perpendicular to the gold strip conductors, and are toned with graphite powder (average particle size 4.5 μm). Finally, both plates are heated to 700° C. for 3 minutes with access to air.

The results are shown in Table 3:

TABLE 3

| | Plate | |
|---|---|---|
| | A | B |
| Electrical resistance: | | |
| Gold strip | 1.2 Ω | 1.5 Ω |
| Graphite strip | 2.0 kΩ | 2.0 kΩ |
| Color of gold strip | brightly shining | gray |

It can be seen from the table that the gold strip without the intermediate treatment of the invention is contaminated by graphite particles.

EXAMPLE 8

A solution of
3.0 g of dimethyl ester of 2,6-dimethyl-4-methyl-1,4-dihydropyridine-3,5-dicarboxylic acid,
3.0 g of diethyl ester of 2,6-dimethyl-4-ethyl-1,4-dihydropyridine-3,5-dicarboxylic acid,
3.0 g of diethyl ester of 2,6-dimethyl-4-isopropyl-1,4-dihydropyridine-3,5-dicarboxylic acid, and 4.0 g of 2,2'-bis(2-chlorophenyl)-4,4',5,5'-tetrakis (3-methoxyphenyl)-biimidazole in 60 mL of methyl ethyl ketone is coated onto a polyester layer support so that the thickness of the dried layer is 1.5 μm.

One part of the material is exposed through a line original for 50 seconds with a light source consisting of parallel UV fluorescent tubes (irradiation intensity 3 mW/cm$^2$ at 360 nm) and is toned with a blue pigment (average particle diameter 3.5 μm).

Then the material is treated with a powder charged with hydrochloric acid according to the data of Example 2. After the powder has been blown off, the material is likewise exposed through a second original for 90 seconds with the above-described light source, and is toned with a red dye powder (average particle diameter 4 μm). A blue and a red image of high color purity are formed.

EXAMPLE 9

A light-sensitive material produced, exposed, and toned with a blue pigment powder as given in Example 8, is divided into 4 samples A-D.

Sample A is treated with a powder produced by mixing 45 parts by weight of 20% sulfuric acid and 55 parts by weight of precipitated silicic acid.

Sample B is treated with a powder produced by mixing 40 parts of weight of 33% p-toluenesulfonic acid and 60 parts by weight of precipitated silicic acid.

Sample C is treated with a powder produced by mixing 40 parts of weight of 33% amidosulfonic acid and 60 parts by weight of precipitated silicic acid.

Sample D remains untreated.

After the excess powder has been removed, the 4 samples are reexposed as given above, whereby parts of the two images overlap. They are then toned with red-emitting phosphor powder. The samples A-C treated with acid show no contamination of the blue areas by red phosphor, whereas test pattern D is contaminated considerably.

I claim:

1. Process for improving the reproduction quality of a negative-working, multiple exposure and toning process for preparing powder images on a substrate bearing a layer of a light-sensitive composition comprising at least one 4-(2'-nitrophenyl)-1,4-dihydropyridine compound, and/or a light-sensitive system comprising at least one 1,4-dihydropyridine compound and at least one hexaarylbisimidazole compound, comprising the steps of:
   (a) exposing said layer imagewise to actinic radiation to produce tacky image areas,
   (b) toning the tacky areas with finely-divided powders, and
   (c) repeating the imagewise exposing and toning steps several times using different images for exposure and different toners, wherein the improvement comprises: treating the light-sensitive layer before the first imagewise exposure and/or between each toning step and the subsequent exposure with a strong inorganic or organic acid having a pKa value of $\leq 2.0$.

2. Process according to claim 1, wherein the light-sensitive layer is treated with a strong volatile acid.

3. Process according to claim 2, wherein the light-sensitive layer is treated with hydrochloric acid.

4. Process according to claim 2, wherein the light-sensitive layer is treated with the vapor of the strong volatile acid.

5. Process according to claim 3, wherein the light-sensitive layer is treated with the vapor of hydrochloric acid.

6. Process according to claim 1, wherein the light-sensitive layer is treated with a finely-divided carrier material charged with the strong acid.

7. Process according to claim 2, wherein the light-sensitive layer is treated with a finely-divided carrier material charged with the strong volatile acid.

8. Process according to claim 3, wherein the light-sensitive layer is treated with a finely-divided carrier material charged with hydrochloric acid.

9. Process according to claim 1, wherein the light-sensitive layer is treated with a finely-divided silicic acid charged with hydrochloric acid.

10. Process according to claim 7, wherein the light-sensitive layer is treated with a finely-divided silicic acid charged with hydrochloric acid.

* * * * *